US010068718B2

(12) United States Patent
Pande et al.

(10) Patent No.: US 10,068,718 B2
(45) Date of Patent: Sep. 4, 2018

(54) FARADAIC ENERGY STORAGE DEVICE STRUCTURES AND ASSOCIATED TECHNIQUES AND CONFIGURATIONS

(71) Applicant: Intel Corporation, Santa Clara, CA (US)

(72) Inventors: Priyanka Pande, Ann Arbor, MI (US); Cary L. Pint, Nashville, TN (US); Yang Liu, Santa Clara, CA (US); Wei Jin, Sunnyvale, CA (US); Charles Holzwarth, San Jose, CA (US); Donald Gardner, Los Altos, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/184,847

(22) Filed: Jun. 16, 2016

(65) Prior Publication Data
US 2016/0300668 A1    Oct. 13, 2016

Related U.S. Application Data

(62) Division of application No. 13/871,953, filed on Apr. 26, 2013, now Pat. No. 9,396,883.

(51) Int. Cl.
*B05D 5/12*    (2006.01)
*H01G 11/84*   (2013.01)
(Continued)

(52) U.S. Cl.
CPC .............. *H01G 11/84* (2013.01); *C23F 1/02* (2013.01); *G03F 7/20* (2013.01); *G03F 7/32* (2013.01);
(Continued)

(58) Field of Classification Search
CPC combination set(s) only.
See application file for complete search history.

(56) References Cited

U.S. PATENT DOCUMENTS

2004/0194574 A1    10/2004  Cardarelli
2005/0142898 A1*    6/2005  Kim .................. H01G 11/46
                                            438/800
(Continued)

FOREIGN PATENT DOCUMENTS

JP      2005-142381    *  6/2005
WO    WO 2011/123135  * 10/2011

OTHER PUBLICATIONS

Non-Final Office Action dated Mar. 13, 2015 in U.S. Appl. No. 13/871,953, filed Apr. 26, 2013, 10 pages.
(Continued)

*Primary Examiner* — Austin Murata
(74) *Attorney, Agent, or Firm* — Schwabe, Williamson & Wyatt, P.C.

(57) ABSTRACT

Embodiments of the present disclosure are directed towards Faradaic energy storage device structures and associated techniques and configurations. In one embodiment, an apparatus includes an apparatus comprising a substrate having a plurality of holes disposed in a surface of the substrate, the plurality of holes being configured in an array of multiple rows and an active material for Faradaic energy storage disposed in the plurality of holes to substantially fill the plurality of holes. Other embodiments may be described and/or claimed.

13 Claims, 7 Drawing Sheets

(51) Int. Cl.
  *H01G 11/04* (2013.01)
  *H01G 11/22* (2013.01)
  *C23F 1/02* (2006.01)
  *G03F 7/20* (2006.01)
  *G03F 7/32* (2006.01)
  *H01M 12/00* (2006.01)

(52) U.S. Cl.
  CPC ............ *H01G 11/04* (2013.01); *H01G 11/22* (2013.01); *H01M 12/005* (2013.01); *Y02E 60/13* (2013.01); *Y10T 29/417* (2015.01)

(56) References Cited

U.S. PATENT DOCUMENTS

| | | |
|---|---|---|
| 2009/0214942 A1 | 8/2009 | Frank et al. |
| 2010/0266897 A1 | 10/2010 | Lee et al. |
| 2011/0297420 A1 | 12/2011 | Gibson et al. |
| 2012/0057273 A1* | 3/2012 | Haight ................ H01G 11/26 361/502 |
| 2013/0069011 A1 | 3/2013 | Thomas et al. |
| 2014/0050988 A1* | 2/2014 | Wei .................... H01M 2/20 429/235 |
| 2014/0139969 A1 | 5/2014 | Hwang et al. |

OTHER PUBLICATIONS

Final Office Action dated Jul. 15, 2015 in U.S. Appl. No. 13/871,953, filed Apr. 26, 2013, 10 pages.
Notice of Allowance dated Mar. 31, 2016 in U.S. Appl. No. 13/871,953, filed Apr. 26, 2013, 10 pages.

\* cited by examiner

FARADAIC ENERGY STORAGE DEVICE STRUCTURES AND ASSOCIATED TECHNIQUES AND CONFIGURATIONS

CROSS REFERENCE TO RELATED APPLICATIONS

The present application is a divisional of U.S. patent application Ser. No. 13/871,953, filed Apr. 26, 2013, entitled "FARADAIC ENERGY STORAGE DEVICE STRUCTURES AND ASSOCIATED TECHNIQUES AND CONFIGURATIONS," the entire disclosure of which is hereby incorporated by reference in its entirety.

FIELD

Embodiments of the present disclosure generally relate to the field of energy storage, and more particularly, to Faradaic energy storage devices.

BACKGROUND

Modern societies depend on the ready availability of energy. As the demand for energy increases, devices capable of efficiently storing energy become increasingly important. As a result, energy storage devices such as, for example, batteries, capacitors, electrochemical capacitors (ECs) including pseudocapacitors and electric double-layer capacitors (EDLCs) (sometimes called "ultracapacitors" among other names), hybrid ECs, and the like are emerging for use in the electronics realm and beyond. In particular, capacitors may be widely used for applications ranging from electrical circuitry and power delivery to voltage regulation and battery replacement. Electrochemical capacitors are characterized by high energy storage capacity, rapid charge/discharge ability, and large cycle lifetimes, as well as other desirable characteristics including high power density, small size and low weight, and have thus become promising candidates for use in several energy storage applications.

Presently, an energy density of Faradaic energy storage devices may be limited by technical challenges associated with increasing or maximizing an available space for active material and decreasing or minimizing space associated with non-active material that may lower the energy density.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example and not by way of limitation in the figures of the accompanying drawings.

Figure 1:
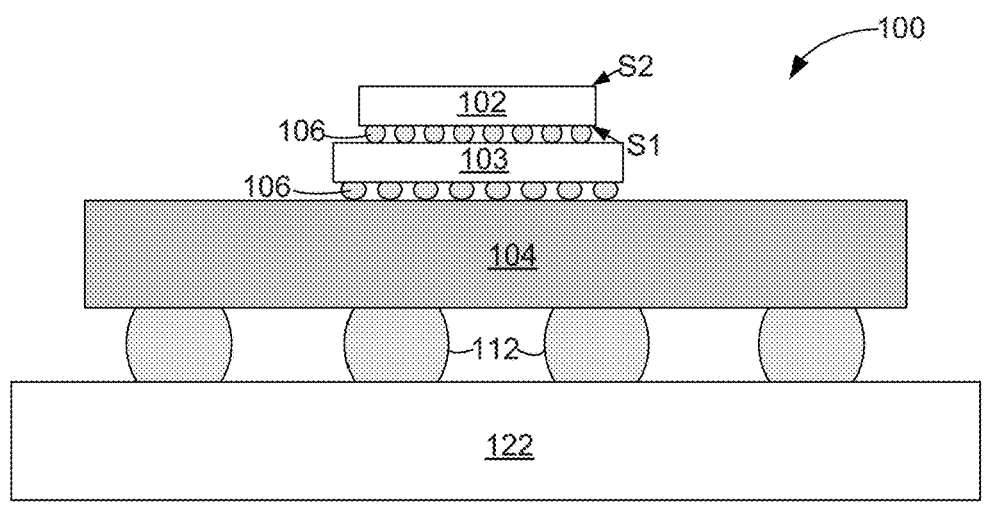
FIG. 1 schematically illustrates a cross-section side view of an example integrated circuit (IC) assembly configured to use a Faradaic energy storage device, in accordance with some embodiments.

For simplicity and clarity of illustration, descriptions and details of well-known features and techniques may be omitted to avoid unnecessarily obscuring the discussion of the described embodiments. Additionally, elements in the drawing figures are not necessarily drawn to scale. For example, the dimensions of some of the elements in the figures may be exaggerated relative to other elements to help improve understanding of various embodiments. Certain figures may be shown in an idealized fashion in order to aid understanding, such as when structures are shown having straight lines, sharp angles and/or parallel planes or the like that under real-world conditions would likely be significantly less symmetric and orderly.

DETAILED DESCRIPTION

Embodiments of the present disclosure describe Faradaic energy storage device structures and associated techniques and configurations. In the following description, various aspects of the illustrative implementations will be described using terms commonly employed by those skilled in the art to convey the substance of their work to others skilled in the art. However, it will be apparent to those skilled in the art that embodiments of the present disclosure may be practiced with only some of the described aspects. For purposes of explanation, specific numbers, materials and configurations are set forth in order to provide a thorough understanding of the illustrative implementations. However, it will be apparent to one skilled in the art that embodiments of the present disclosure may be practiced without the specific details. In other instances, well-known features are omitted or simplified in order not to obscure the illustrative implementations.

In the following detailed description, reference is made to the accompanying drawings which form a part hereof, wherein like numerals designate like parts throughout, and in which is shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use perspective-based descriptions such as top/bottom, in/out, over/under, and the like. Such descriptions are merely used to facilitate the discussion and are not intended to restrict the application of embodiments described herein to any particular orientation.

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

The term "coupled with," along with its derivatives, may be used herein. "Coupled" may mean one or more of the following. "Coupled" may mean that two or more elements are in direct physical or electrical contact. However, "coupled" may also mean that two or more elements indirectly contact each other, but yet still cooperate or interact with each other, and may mean that one or more other elements are coupled or connected between the elements that are said to be coupled with each other. The term "directly coupled" may mean that two or more elements are in direct contact.

In various embodiments, the phrase "a first feature formed, deposited, or otherwise disposed on a second feature," may mean that the first feature is formed, deposited, or disposed over the second feature, and at least a part of the first feature may be in direct contact (e.g., direct physical and/or electrical contact) or indirect contact (e.g., having one or more other features between the first feature and the second feature) with at least a part of the second feature.

As used herein, the term "module" may refer to, be part of, or include an Application Specific Integrated Circuit (ASIC), an electronic circuit, a system-on-chip (SoC), a processor (shared, dedicated, or group) and/or memory (shared, dedicated, or group) that execute one or more software or firmware programs, a combinational logic circuit, and/or other suitable components that provide the described functionality.

Faradaic energy storage devices may include electrochemical capacitors (ECs) that operate according to principles similar to those that govern conventional parallel plate capacitors, but certain important differences may apply. One significant difference concerns the charge separation mechanism. For one important class of ECs this typically takes the form of a so-called electric double layer, or EDL, rather than the dielectric of a conventional capacitor. The EDL is created at an interface between an electrolyte and a high-surface area electrode by the electrochemical behavior of electrons (or electronic holes) on one side of the interface and two regions of ionic charge carriers on the other side (the double layer), and results in an effective separation of charge in spite of the fact that the two layers are so close together (Physical separation distances may be on the order of a single nanometer). Each layer of the charge-storage region, which is formed when a voltage is applied across the interface, is electrically conductive—conduction is performed by ions in the electrolyte and by electrons/holes in the electrode—but the properties of the double layer prevent current from flowing across the boundary between them.

As is true in conventional capacitors, capacitance in an EDL capacitor is proportional to the surface area of the electrodes and inversely proportional to the charge separation distance. The very high capacitances achievable in an EDL capacitor may be due in part to a very high surface area attributable to a multi-channel porous structure and to a nanometer-scale charge separation distance attributable to the EDL, which arises due to the presence of an electrolyte, as explained above. One type of electrolyte that may be used in accordance with embodiments is an ionic liquid. Another is an electrolyte comprising an ion-containing solvent. Organic electrolytes, aqueous electrolytes, and solid-state electrolytes are also possible.

Faradaic energy storage devices may include certain classes of electrochemical capacitor such as a pseudocapacitor, where, in addition to EDL capacitance, an additional storage mechanism—one that is Faradaic and not electrostatic in origin—can arise at the surface of certain types of electrodes. The additional storage mechanism is typically referred to as "pseudocapacitance," and is characterized by a charge storage process that is similar to the operation of many solid-electrode batteries. The two storage mechanisms complement each other, leading to even greater energy storage potential than is possible with EDL capacitance alone. Typically, one of the electrodes of a pseudocapacitor is coated with a transition metal oxide, a suitable conducting polymer, or a similar material that makes up the active material where charge is stored. These materials can be used with an electrolyte such as a potassium hydroxide (KOH) solution; when the device is charged, the electrolyte will react with the material and drive a charge transfer reaction where energy is stored. More specifically, these materials store most of their energy through highly-reversible surface and near-surface electron transfer (e.g., redox (Faradaic)) reactions, which enable higher power than bulk storage in conventional batteries due to the fast charge and discharge kinetics. An electrode (e.g., second electrode or active material) of a pseudocapacitor may be comprised of a complementary pseudocapacitor material or a non-Faradaic material with high surface area such as, for example, activated carbon.

It will be understood that pseudocapacitors may be constructed using electrolytes other than the one mentioned above. For example, ion-containing solvents such as $Li_2SO_4$ or $LiPF_6$ may be used as the electrolyte; these result in an intercalation reaction that involves the insertion of a species into the surface of the host structure without breaking any bonds. This reaction, like the other pseudocapacitive reactions mentioned earlier, results in a transfer of charge so it too is Faradaic and considered a redox reaction, albeit a special type of redox reaction.

Another class of electrochemical capacitors, hybrid electrochemical capacitors, are Faradaic energy storage devices that combine the attributes of ECs and batteries. In one example, an electrode coated with a lithium ion material is combined with an electrochemical capacitor in order to create a device that has an EC's rapid charge and discharge characteristics and a battery's high energy density. On the other hand, hybrid ECs, like batteries, have shorter expected lifespans than do electrochemical capacitors.

Faradaic energy storage devices according to embodiments described herein can be used for a wide variety of applications, including in personal computers (PCs), desktop and laptop (notebook) computers, tablet computers, cell phones, smart phones, music players, servers, other electronic devices, automobiles, buses, trains, airplanes, other transportation vehicles, home energy storage, storage for energy generated by solar or wind energy generators—especially energy harvesting devices—and many others.

FIG. 1 schematically illustrates a cross-section side view of an example integrated circuit (IC) assembly 100 configured to use a Faradaic energy storage device (e.g., Faradaic energy storage device 600, 700, 800, 900, 1000 or 1100 of respective FIGS. 6-11) in accordance with some embodiments. In some embodiments, the IC assembly 100 may include one or more IC dies (hereinafter "die 102") configured to electrically and/or physically couple with a package substrate 104. In the depicted embodiment, the die 102 is electrically coupled with the package substrate 104 through an interposer 103, as can be seen.

The IC assembly 100 may further include a package substrate 104 electrically coupled with the interposer 103 and/or the die 102. The package substrate 104 may further be electrically coupled with a circuit board 122. In some embodiments, the IC assembly 100 may refer to any component of the IC assembly that is configured to receive energy from the Faradaic energy storage device.

According to various embodiments, one or more of the components of the IC assembly 100 may be configured to receive energy from one or more Faradaic energy storage devices. For example, in some embodiments, one or more of the die 102, the interposer 103, the package substrate 104 or the circuit board 122 may include a substrate or be coupled with a substrate that includes structures (e.g., filled holes 508 of FIG. 5) of a Faradaic energy storage device described herein. In one embodiment, the die 102 is configured to receive energy from one or more Faradaic energy storage devices formed in a substrate of the die 102, the interposer 103, the package substrate 104, the circuit board 122 or another discrete component (e.g., Faradaic energy storage device 1320 of FIG. 13) coupled with one of the die 102, the interposer 103, the package substrate 104 or the circuit board 122.

The IC assembly 100 may include a wide variety of other suitable configurations in other embodiments including, for example, suitable combinations of flip-chip and/or wire-bonding configurations, multiple interposers, multi-chip package configurations including system-in-package (SiP) and/or package-on-package (PoP) configurations to route electrical signals between the die 102 and other components of the IC assembly 100 in some embodiments. The electrical signals may include, for example, input/output (I/O) and/or power/ground signals associated with operation of the die 102.

The die 102 may represent a discrete unit made from a semiconductive material using semiconductor fabrication techniques such as thin film deposition, photolithography, etching and the like. In some embodiments, the die 102 may be, include, or be a part of a processor, memory, SoC or ASIC in some embodiments.

The die 102 can be attached to the package substrate 104 according to a wide variety of suitable configurations including, for example, being directly coupled with the interposer 103 in a flip-chip configuration and the interposer 103 being directly coupled with the package substrate 104 in a flip-chip configuration, as depicted. In the flip-chip configuration, an active side (e.g., side S1) of the die 102 is attached to a surface of the interposer 103 using interconnect structures 106 such as bumps, pillars, or other suitable structures that may also electrically couple the die 102 with the interposer 103. The active side of the die 102 may include electronic circuitry such as, for example, a plurality of integrated circuit (IC) devices, which may include transistor devices. In some embodiments, an electrically insulative material such as, for example, molding compound or underfill material (not shown) may be deposited on a surface of the package substrate 104 to partially or fully encapsulate the die 102, the interposer 103 and/or interconnect structures 106.

The die 102 may include electrical routing features disposed on one or more surfaces of the die 102 such as pads or traces (not shown) and/or internal routing features (not shown) such as, for example, trenches, vias or other interconnect structures to route electrical signals to or from the plurality of IC devices (e.g., transistors) formed on the die. In some embodiments, such routing features may be configured to route energy from a Faradaic energy storage device to transistors of the die 102. In some embodiments, the transistor devices may be operatively coupled with the Faradaic energy storage device to receive energy from the Faradaic energy storage device. In one embodiment, the Faradaic energy storage device is formed in a substrate (e.g., silicon) of the die 102 and is electrically coupled with the transistors using the routing features formed on the die. For example, the Faradaic energy storage device may be formed on an active side (e.g., side S1) or an inactive side (e.g., side S2) of the die 102.

The interposer 103 may be a component of the IC assembly 100 that does not include active transistor devices, but is configured to route electrical signals to or from the die 102 (e.g., in a fan-out arrangement). In embodiments, the interposer 103 may be composed of a semiconductive material (e.g., silicon), glass, a polymer, ceramic or other suitable material.

The interposer 103 may include electrical routing features to route electrical signals of the die 102 to or from the package substrate 104. The electrical routing features (not shown) may include, for example, bond pads or traces disposed on one or more surfaces of the interposer 103 and/or internal routing features such as, for example, trenches, vias or other interconnect structures to route electrical signals through the interposer 103. For example, in some embodiments, the interposer 103 may include electrical routing features such as bond pads (not shown) configured to receive the interconnect structures 106 disposed between the die 102 and the interposer 103 and to route electrical signals between the die 102 and the package substrate 104. The interposer 103 may be coupled with the package substrate 104 using interconnect structures 106 or any other suitable technique.

In some embodiments, the package substrate 104 is an epoxy-based laminate substrate having a core and/or build-up layers such as, for example, an Ajinomoto Build-up Film (ABF) substrate. The package substrate 104 may include other suitable types of substrates in other embodiments including, for example, substrates formed from glass, ceramic, or semiconductive materials.

The package substrate 104 may include electrical routing features configured to route the electrical signals to or from the die 102 (e.g., via the interposer 103). The electrical routing features may include, for example, pads or traces disposed on one or more surfaces of the package substrate 104 and/or internal routing features (not shown) such as, for example, trenches, vias or other interconnect structures to route electrical signals through the package substrate 104. In some embodiments, such routing features may be configured to route energy from a Faradaic energy storage device to transistors of the die 102.

In some embodiments, the circuit board 122 may be a printed circuit board (PCB) composed of an electrically insulative material such as an epoxy laminate. For example, the circuit board 122 may include electrically insulating layers composed of materials such as, for example, polytetrafluoroethylene, phenolic cotton paper materials such as Flame Retardant 4 (FR-4), FR-1, cotton paper and epoxy materials such as CEM-1 or CEM-3, or woven glass materials that are laminated together using an epoxy resin prepreg material. The circuit board 122 may be composed of other suitable materials in other embodiments.

The circuit board 122 may include electrical routing features (not shown) such as pads, traces, trenches, vias and the like that may be formed through the electrically insulating layers to route the electrical signals of the die 102 through the circuit board 122. In some embodiments, such routing features may be configured to route energy from a Faradaic energy storage device to transistors of the die 102. In some embodiments, the circuit board 122 is a motherboard (e.g., motherboard 1502 of FIG. 15).

Package level interconnects such as, for example, ball-grid array (BGA) structures (e.g., solder balls 112) or land-grid array (LGA) structures may be disposed between the package substrate 104 and on the circuit board 122 to form corresponding joints that route the electrical signals between the package substrate 104 and the circuit board 122. Other suitable techniques to physically and/or electrically couple the package substrate 104 with the circuit board 122 may be used in other embodiments.

Figure 2:
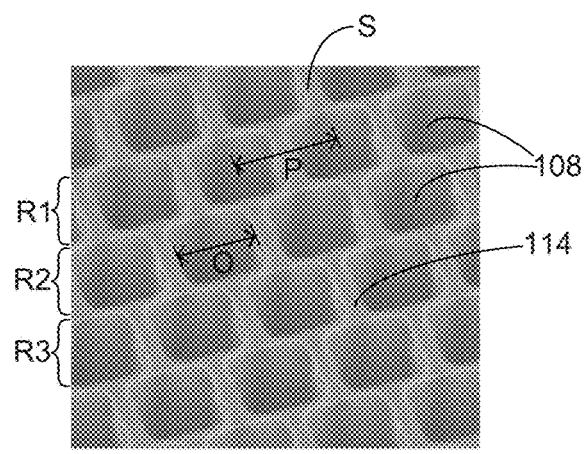
FIG. 2 is a perspective image of holes of a Faradaic energy storage device formed in a substrate, in accordance with some embodiments.

FIG. 2 is a perspective image of holes 108 of a Faradaic energy storage device formed in a substrate 114, in accordance with some embodiments. The holes 108 may be formed in a surface (e.g., surface S) of a substrate 114 composed of any of a wide variety of suitable substrate materials. For example, in some embodiments, the substrate 114 may be composed of a semiconductive material (e.g., silicon), metal or polymer. According to various embodiments, the substrate 114 may be a material (e.g., a layer) of the die 102, the interposer 103, the package substrate 104 or the circuit board 122 of FIG. 1. In other embodiments, the substrate 114 may be an independent discrete structure that is electrically coupled with one or more of the die 102, the interposer 103, the package substrate 104 or the circuit board 122 of FIG. 1 using well-known semiconductor fabrication techniques.

In some embodiments, the substrate 114 may be composed of silicon in one of various forms including metallurgical grade silicon, monocrystalline silicon, polycrystalline silicon, and silicon-on-insulator (SOI). Possible advantages of using silicon include compatibility with existing silicon technology and the abundance of silicon in the earth's crust. As an example, the holes 108 may be created by etching the silicon using a wet etch process including anisotropic, chemical or electrochemical etch processes. In one embodiment, the silicon is etched with a mixture of hydrofluoric acid (HF) and alcohol (ethanol, methanol, isopropyl, etc.).

In some embodiments, the substrate 114 may be composed of other materials (besides silicon) that may be especially well-suited for energy storage devices according to embodiments of the present disclosure including, for example, germanium and tin. Germanium enjoys a similar advantage as silicon a result of existing technology for that material and, as compared to silicon, enjoys the further possible advantage that its native oxide (germanium oxide) is water-soluble and so is more easily removed. A native oxide that forms on the surface of silicon may undesirably trap charge. Germanium is also highly compatible with silicon technology. Possible advantages of using tin, which is a zero-band-gap material, include its enhanced conductivity with respect to certain other conductive and semiconductive materials.

The substrate 114 may be composed of other semiconducting materials such as gallium arsenide (GaAs), indium phosphide (InP), boron nitride (BN), silicon carbide (SiC), and alloys such as an alloy of silicon and germanium. Organic semiconductors may also be used. In some embodiments the semiconducting materials—or even insulating materials—may be treated to make them electrically conductive (or more highly conductive). For example, silicon may be degenerately doped with boron. In some embodiments, the substrate 114 may be composed of carbon or of metals such as copper, aluminum, nickel, calcium, tungsten, molybdenum, and manganese. According to various embodiments, the substrate 114 may include metal foils, metal sheets, laminate structures and the like.

The holes 108 can be generally formed according to a wide variety of suitable techniques including, for example, etch and/or photolithography techniques. For example, in addition to the wet etch process already described, dry etch processes such as reactive-ion etching can be used. In some embodiments, the photolithography techniques may include imprint lithography or shadow-masking. In other embodiments, the holes 108 may be formed using techniques that do not require an etch process. For example, the holes may be formed in a substrate 114 composed of a polymer material such as, for example, a photosensitive polymer (e.g., epoxy-based photoresist), that can be patterned using photolithography and portions of the patterned polymer can be removed using a development process. In some embodiments, the starting material of the substrate 114 may undergo a chemical change during or after forming holes 108. For example, aluminum may change to alumina after forming holes 108 through an anodization process. In other embodiments, the polymer may be converted to an electrically conductive material (e.g., glassy carbon) through pyrolosis.

The holes 108 may be used to hold active material of a Faradaic energy storage device in a densely-packed configuration that increases (e.g., maximizes) a density of active material and decreases (e.g., minimizes) a density of non-active material (e.g., material of the substrate 114) in the Faradaic energy storage device. In some embodiments, the holes 108 are configured in an array of multiple rows (e.g., rows R1, R2, R3 . . . etc.), as can be seen, to provide a three-dimensional (3D) configuration for the active material in the substrate 114.

Figure 3:
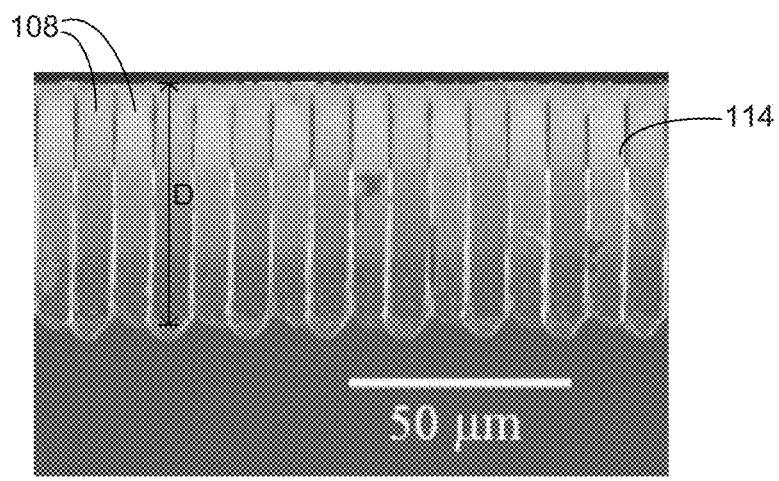
FIG. 3 is a cross-section side-view image of holes of a Faradaic energy storage device formed in a substrate, in accordance with some embodiments.
Figure 4:
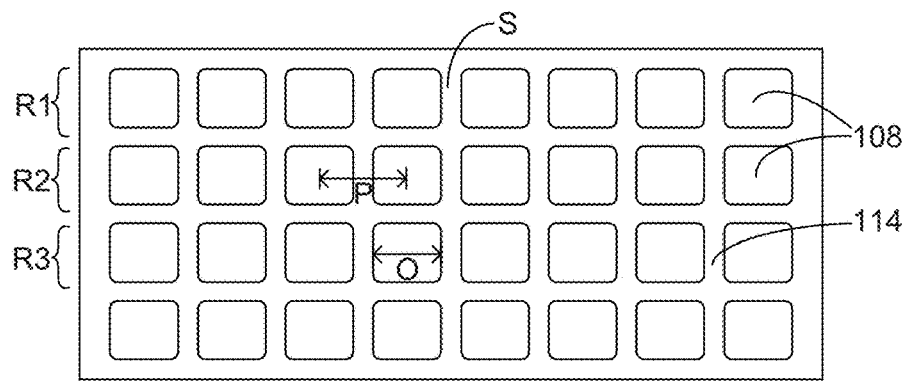
FIG. 4 schematically illustrates a top view of holes of a Faradaic energy storage device formed in a substrate, in accordance with some embodiments.

FIG. 3 is a cross-section side-view image of holes 108 of a Faradaic energy storage device formed in a substrate 114, in accordance with some embodiments. FIG. 4 schematically illustrates a top view of holes 108 of a Faradaic energy storage device formed in a substrate 114, in accordance with some embodiments. Referring to FIGS. 2-4, the holes 108 may be formed in a dense configuration with fine pitch, P, between the holes 108, as can be seen. According to various embodiments, the pitch P may have a value from 1 micron to 250 microns (μm). In some embodiments, all or substantially all adjacent holes of the holes 108 may be separated by sidewalls of the substrate 114 that are disposed between the adjacent holes. In some embodiments, the sidewalls of the substrate 114 have a dimension that is parallel with and smaller than a dimension, O, across an opening of one of the holes 108, as can be seen. In some embodiments, the dimension O has a value from 0.1 micron to 200 microns. A depth, D of the holes 108 may have a value from 5 microns to 500 microns. The holes 108 may have other suitable dimensions in other embodiments.

In some embodiments, adjacent rows of the multiple rows (e.g., rows R1, R2, R3) may be configured in a staggered arrangement relative to one another as depicted in FIG. 2. In other embodiments, adjacent rows of the multiple rows may not be staggered relative to one another and may have continuous sidewalls that extend in perpendicular directions across multiple rows as depicted in FIG. 4. The staggered arrangement may facilitate formation of a higher density array of holes 108, in particular, for holes 108 having rounded edges relative to a non-staggered arrangement. In other embodiments, the holes 108 may not be arranged in rows at all and may have no long range order. Although the holes 108 are depicted with a particular profile shape in FIGS. 2-4, the holes 108 may have other shapes or configurations in other embodiments including a variety of polygons or circular shapes or combinations thereof.

Figure 5:
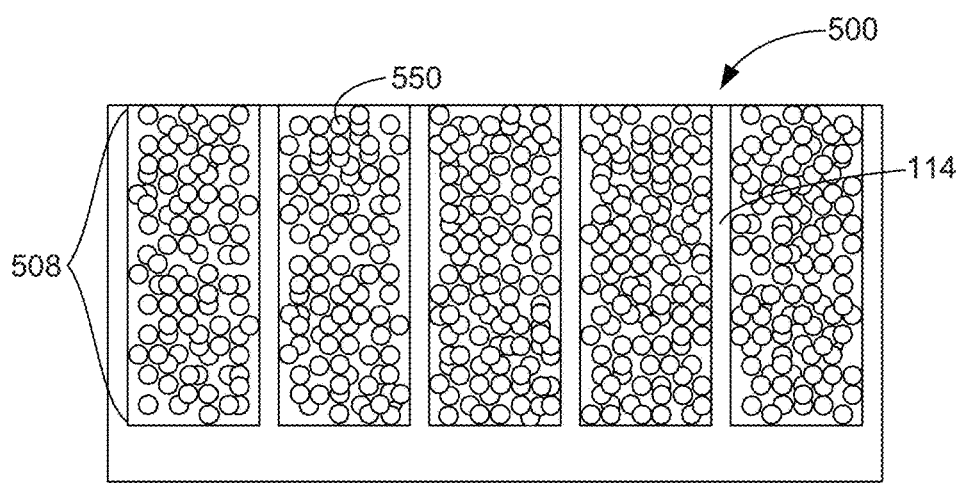
FIG. 5 schematically illustrates a cross-section side view of holes filled with an active material for Faradaic energy storage, in accordance with some embodiments.

FIG. 5 schematically illustrates a cross-section side view of holes filled (hereinafter "filled holes 508") with an active material 550 for Faradaic energy storage, in accordance with some embodiments. The filled holes 508 may provide a Faradaic energy storage structure 500. The holes 108 formed in the substrate 114 of FIGS. 2-4 may be subsequently filled with the active material 550 to provide the filled holes 508 according to a wide variety of techniques.

In some embodiments, the active material may include, for example, active material for a lithium (Li)-ion battery electrode or a pseudo-capacitive material 550. The active material for a Li-ion battery electrode may include, for example, graphite, $LiCoO_2$, $LiFePO_4$, $LiMn_xNi_yCo_zO_2$ and the like, where x, y and z represent suitable relative quantities of the elements. The pseudo-capacitive material 550 may include one or more transition metal -oxides, -nitrides, or -carbides or polymers that exhibit pseudo-capacitive properties in the presence of ionic species such as, for example, vanadium nitride or vanadium oxide. In some embodiments, the pseudo-capacitive material 550 may include, an anode material such as, for example, one or more of Si, $SnO_2$, $TiO_2$, $Nb_2O_5$ and the like or a cathode material such as, for example, one or more of $LiCoO_2$, $LiMnO_2$, $Mg_xMo_3S_4$, $MgMnO_2$, $MgCo_2O_4$ and the like, where x represents a suitable relative quantity of the element. Other suitable active materials may be used including, for example, $MnO_2$, $RuO_2$ and conductive polymers. An electrolytic capacitor structure may be formed using an active material such as, for example, high-k dielectrics including $ZrO_2$, $HfO_2$, $TiO_2$, $Y_2O_3$, $Al_2O_3$, $Ta_2O_5$. The active material may further include different suitable stoichiometry or combinations of the above materials. For example, the active material may include $LiCoO_4$.

The pseudo-capacitive material 550 may be in the form of micro-scale or nano-scale powders, which can be mixed with conductive additive materials such as, for example, carbon materials (e.g., carbon black) and/or a binder material such as, for example, polyvinylidenefluoride or polytetrafluoroethylene.

The pseudo-capacitive material 550 or the mixture including the pseudo-capacitive material may be deposited to fill or substantially fill the holes to provide the filled holes 508 using, for example, one or more of a doctor-blading, drop-casting, spin-casting or vacuum casting technique. Such techniques may be less costly than alternative deposition techniques such as, for example, stop-flow atomic layer deposition.

FIGS. 6-11 depict various configurations for a Faradaic energy storage device 600 that includes filled holes 508 as described herein. Contacts are depicted with + and − signs to indicate electrical potential according to one embodiment. In other embodiments, the + and − signs may be reversed.

Figure 6:
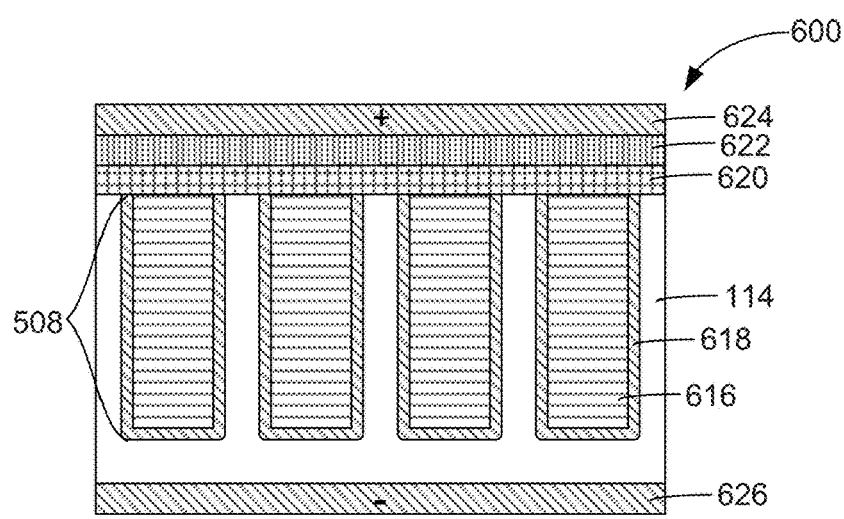
FIG. 6 schematically illustrates a cross-section side view of a Faradaic energy storage device in a parallel configuration with top and bottom contacts, in accordance with some embodiments.

FIG. 6 schematically illustrates a cross-section side view of a Faradaic energy storage device 600 in a parallel configuration with top and bottom contacts (e.g., contacts 624, 626), in accordance with some embodiments. The Faradaic energy storage device 600 may include filled holes 508 disposed in a substrate 114. The filled holes 508 may be filled or substantially filled with an active material such as first active material 616 (e.g., a pseudo-capacitive material 550 of FIG. 5) for Faradaic energy storage as described herein.

In some embodiments, the filled holes 508 may further include a barrier liner 618 disposed between the first active material 616 and the substrate to prevent side reactions such as, for example, non-reversible Faradaic reactions between the first active material 616 and surrounding materials (e.g., material of substrate 114) and/or to increase electrical conductivity. In various embodiments, the barrier liner 618 may include a thin coating (e.g., 10 nm to 1000 nm) of a passive material that is electrically conductive and/or does not intercalate ions such as, for example, Li, Mg, Al, Ca, or Zn ions and the like or does not react with Li-based or multi-valent-ion based metals or mixed-metal -oxides, -nitrides, -silicates, -phosphates, -fluorides, or sulfur-based materials and the like. The barrier liner 618 may, for example, be composed of Cu, Ni, Ti, TiN, TiSiN, Ta, TaN, TaSiN, W or Al, or suitable combinations thereof.

Material of the barrier liner 618 may be deposited using any suitable deposition process including physical vapor deposition (PVD), atomic layer deposition (ALD), chemical vapor deposition (CVD) or an electrochemical deposition process such as electroplating. For example, the barrier liner 618 may be deposited subsequent to forming the holes (e.g., holes 108 of FIGS. 2-4) and prior to filling the holes with active material to provide filled holes (e.g., filled holes 508 of FIGS. 5-6). The barrier liner 618 may include multiple films and/or materials in some embodiments.

An electrolyte 620, also referred to as a "separator," may be coupled with the first active material 616 and a second active material 622 may be coupled with the electrolyte 620, as can be seen. In the depicted embodiment, the electrolyte 620 and the second active material 622 are configured as layers disposed on the substrate 114. The electrolyte 620 may be disposed between the first active material 616 and the second active material 622 to conduct ions between the first active material 616 and the second active material 622. In some embodiments, the electrolyte 620 is disposed on the surface of the substrate 114 and in direct contact with the first active material 616 disposed in the filled holes 508 and the second active material 622 is disposed on and in direct contact with the electrolyte 620.

In some embodiments, the electrolyte 620 is a substance (liquid or solid, including gel-like materials) containing free ionic charge carriers such as an ionic liquid (e.g., 1-butyl-3-methylimidazolium tetrafluoroborate), aqueous-based material (e.g., aqueous KOH) or organic solvent-based material (e.g., $LiPF_6$ in dimethyl carbonate) and may include gels, polymers, ceramics, other suitable materials or combinations thereof. The electrolyte may be deposited by any suitable method including, for example, spin-coating, drop-casting, CVD, liquid injection or vacuum casting. The second active material 622 include materials described in connection with the first active material 616 or non-Faradaic materials such as, for example, activated carbon and the like. may be deposited by any suitable method including, for example, one or more of doctor-blading, drop-casting, spin-casting, vacuum casting, CVD or PVD.

The first active material 616 may have a higher reference potential (e.g., standard electrode potential) than the second material. For example, in one embodiment, the first active material 616 may be a cathode material and the second active material 622 may be an anode material. In another embodiment, the first active material 616 may have a lower reference potential than the second active material 622 and the first active material 616 may be an anode material and the second active material 622 may be a cathode material.

The Faradaic energy storage device 600 may further include contacts 624, 626 composed of an electrically conductive material. The contacts 624, 626 may be respectively coupled with the second active material 622 and the first active material 616 to drive operation of the Faradaic energy storage device 600. For example, applying an external voltage between electrical contacts 624 and 626 may charge the Faradaic energy storage device 600. During charging, the applied voltage may lower potential barriers for Faradaic reactions to occur between the electrolyte 620 and the first active material 616 and/or second active material 622, resulting in stored energy. Subsequent to charging, the Faradaic energy storage device 600 may hold a potential difference between contacts 624 and 626 equal to or slightly less than the applied external voltage. The stored energy in the Faradaic energy storage device 600 may be released by connecting a load (e.g., transistor or other device) between contacts 626 and 626.

Figure 7:
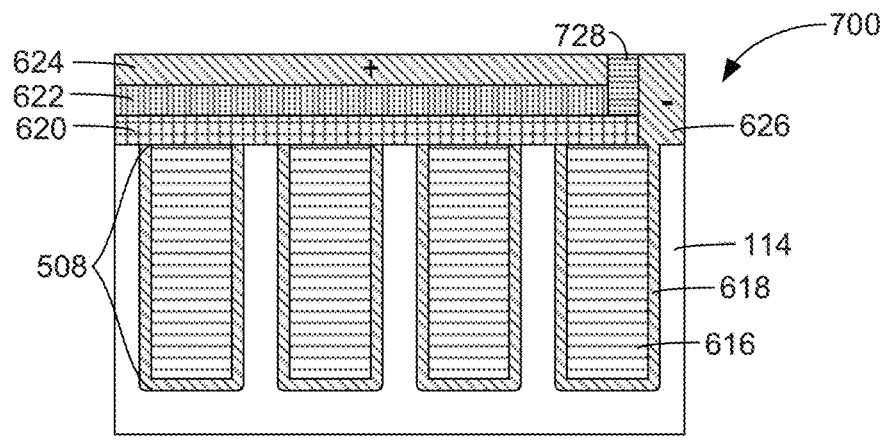
FIG. 7 schematically illustrates a cross-section side view of a Faradaic energy storage device in a parallel configuration with top contacts, in accordance with some embodiments.

FIG. 7 schematically illustrates a cross-section side view of a Faradaic energy storage device 700 in a parallel configuration with top contacts (e.g., contacts 624, 626), in accordance with some embodiments. The Faradaic energy storage device 700 may comport with embodiments described in connection with Faradaic energy storage device 600 of FIG. 6, except that in FIG. 7, the contacts 624, 626 are disposed on or over the surface of the substrate 114 to provide a parallel configuration with only top contacts. A non-conductive barrier 728 may be disposed between the contacts 624, 626 to prevent shorting between the contacts 624, 626. The non-conductive barrier 728 may be composed of any suitable electrically insulative material including, for example, $SiO_2$, $TiO_2$, $Al_2O_3$, SiC, polymer and the like.

Figure 8:
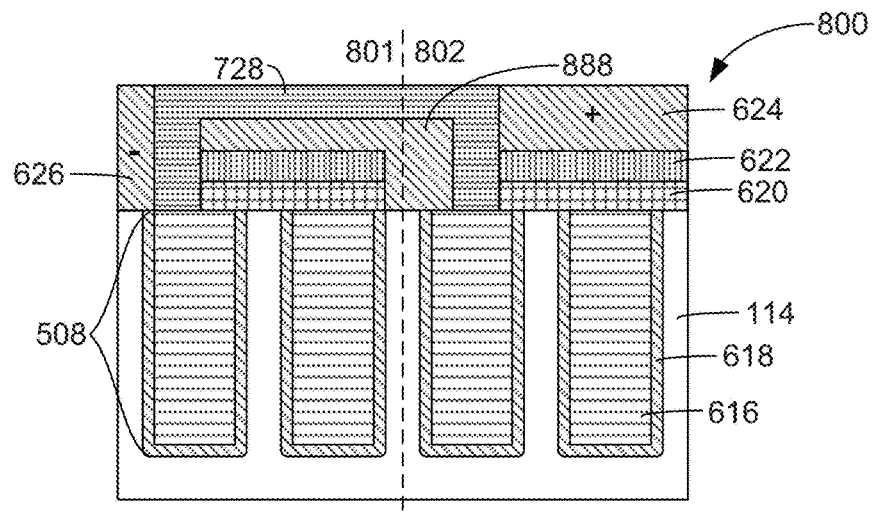
FIG. 8 schematically illustrates a cross-section side view of a Faradaic energy storage device in a series configuration with top contacts, in accordance with some embodiments.

FIG. 8 schematically illustrates a cross-section side view of a Faradaic energy storage device 800 in a series configuration with top contacts (e.g., contacts 624, 626), in accordance with some embodiments. In some embodiments, a non-conductive barrier 728 and embedded conductor 888 may be disposed between portions of the electrolyte 620 and the second active material 622 and between contacts 624, 626, as can be seen to provide the series configuration. In this configuration, two electrochemical cells (e.g., cells 801 and 802 demarcated by the dashed line) are in series. An external voltage applied across contacts 624 and 626 for charging would be twice that of the external voltage for charging the Faradaic energy storage device 700 of FIG. 7, assuming the same active materials are used. The configuration of FIG. 8 can be extended to include N cells in series resulting a in a voltage up to N times what would be produced with the configuration of FIG. 7.

Figure 9:
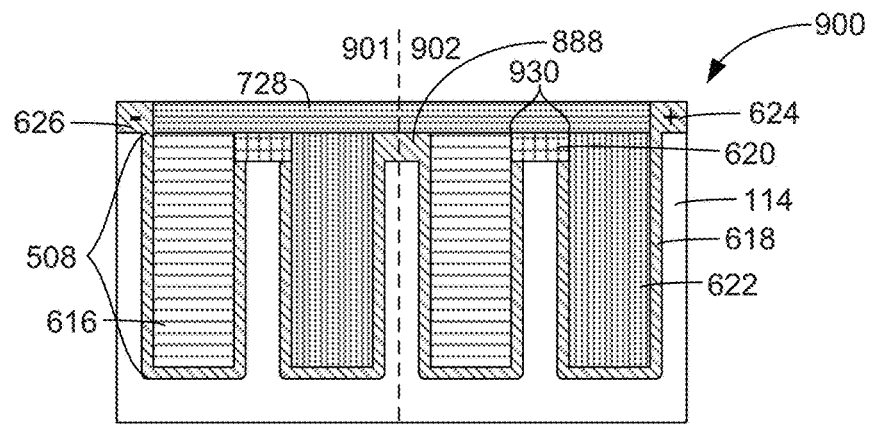
FIG. 9 schematically illustrates a cross-section side view of a Faradaic energy storage device in a series configuration with top contacts and one or more ion channels, in accordance with some embodiments.

FIG. 9 schematically illustrates a cross-section side view of a Faradaic energy storage device 900 in a series configuration with top contacts (e.g., contacts 624, 626) and one or more ion channels (e.g., ion channel 930), in accordance with some embodiments. In some embodiments, both the first active material 616 and the second active material 622 may be disposed in the filled holes 508 formed in the surface of the substrate 114, as can be seen. In some embodiments, a non-conductive barrier 728 and embedded conductor 888 may be disposed between contacts 624, 626, as can be seen to provide the series configuration. In this configuration, two electrochemical cells (e.g., cells 901 and 902 demarcated by the dashed line) are in series.

In some embodiments, an ion channel 930 for the electrolyte 620 may be formed between a filled hole containing the first active material 616 and a filled hole containing the second active material 622. For example, in some embodiments, the ion channel 930 may be formed by micromachine techniques such as, for example, laser drilling to make microscopic holes or recesses in which the ion channel 930 can be built from stable, solid-state electrolyte materials that can be deposited by PVD into the microscopic holes. The microscopic holes may be formed subsequent to forming holes 108 of FIGS. 2-4 in some embodiments. The ion channel 930 may increase voltage capability of the Faradaic energy storage device by coupling multiple pairs of filled holes 508 in some embodiments.

A non-conductive barrier 728 may be disposed on the first active material 616, the second active material 622 and the ion channels (e.g., ion channel 930), as can be seen. In some embodiments, the Faradaic energy storage device 900 includes alternating filled holes 508 with the first active material 616 and the second active material 622, as can be seen.

Figure 10:
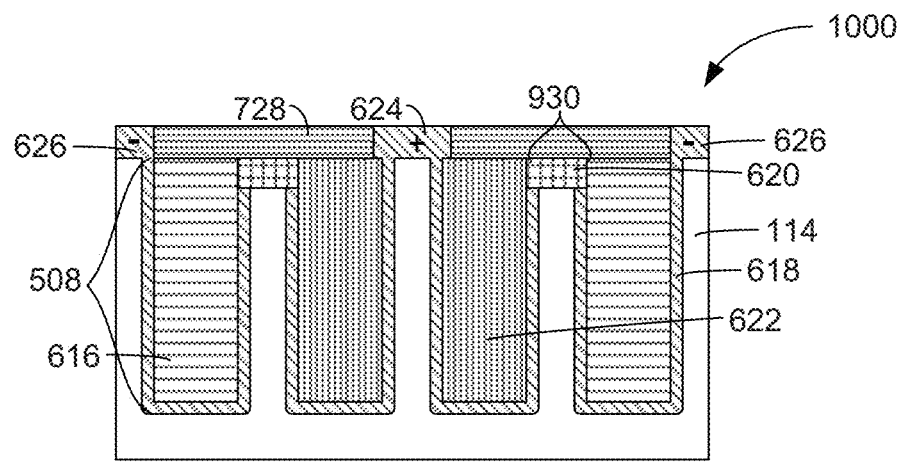
FIG. 10 schematically illustrates a cross-section side view of a Faradaic energy storage device in a parallel configuration with top contacts and one or more ion channels, in accordance with some embodiments.

FIG. 10 schematically illustrates a cross-section side view of a Faradaic energy storage device 1000 in a parallel configuration with top contacts (e.g., contacts 624, 626) and one or more ion channels (e.g., ion channel 930), in accordance with some embodiments. The ion channel 930 may comport with embodiments described in connection with Faradaic energy storage device 900 of FIG. 9. In some embodiments, the Faradaic energy storage device 1000 includes adjacent filled holes 508 that are filled with a same active material (e.g., second active material 622 in the depicted embodiment). The adjacent filled holes 508 may also be adjacent to other filled holes 508 that have a different active material (e.g., first active material 616 in the depicted embodiment), as can be seen.

Figure 11:
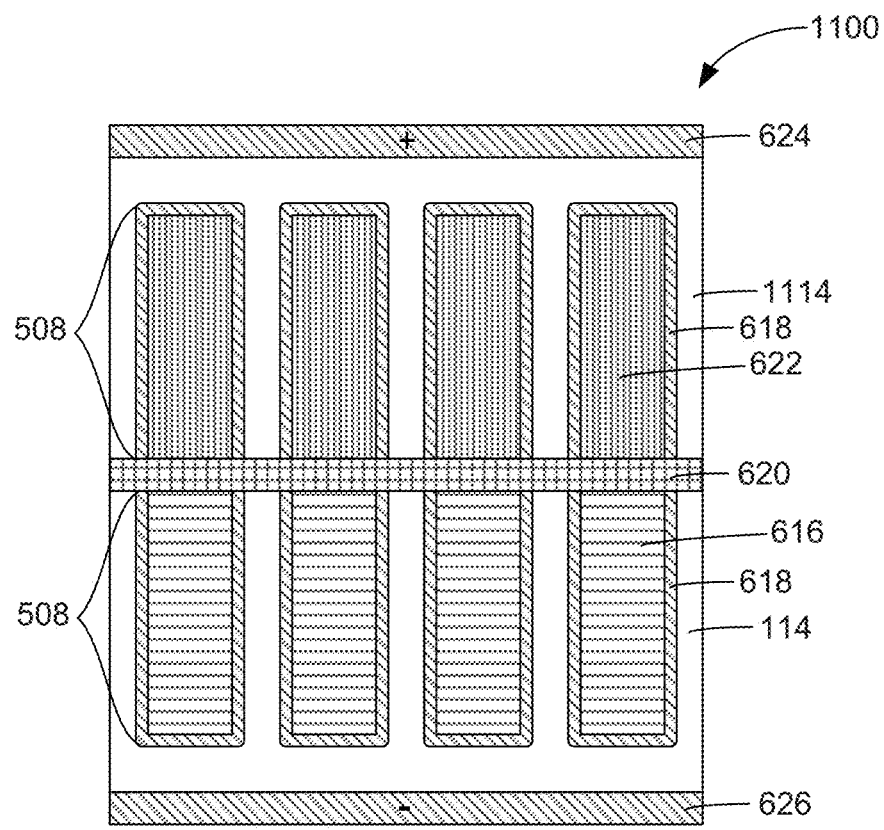
FIG. 11 schematically illustrates a cross-section side view of another Faradaic energy storage device in a parallel configuration with top contacts and bottom contacts, in accordance with some embodiments.

FIG. 11 schematically illustrates a cross-section side view of another Faradaic energy storage device 1100 in a parallel configuration with top and bottom contacts (e.g., contacts 624, 626), in accordance with some embodiments. In some embodiments, the Faradaic energy storage device 1100 may include a first substrate (e.g., substrate 114) having filled holes 508 formed therein that are filled with the first active material 616 and a second substrate (e.g., substrate 1114) having filled holes 508 formed therein that are filled with the second active material 622. An electrolyte 620 may be disposed between the first active material 616 and the second active material 622, as can be seen.

According to various embodiments, embodiments described and/or depicted for Faradaic energy storage devices 600, 700, 800, 900, 1000, 1100 may be suitably combined. The embodiments of techniques and configurations described in connection with FIGS. 1-11 may be suitable combined in some embodiments.

Figure 12:
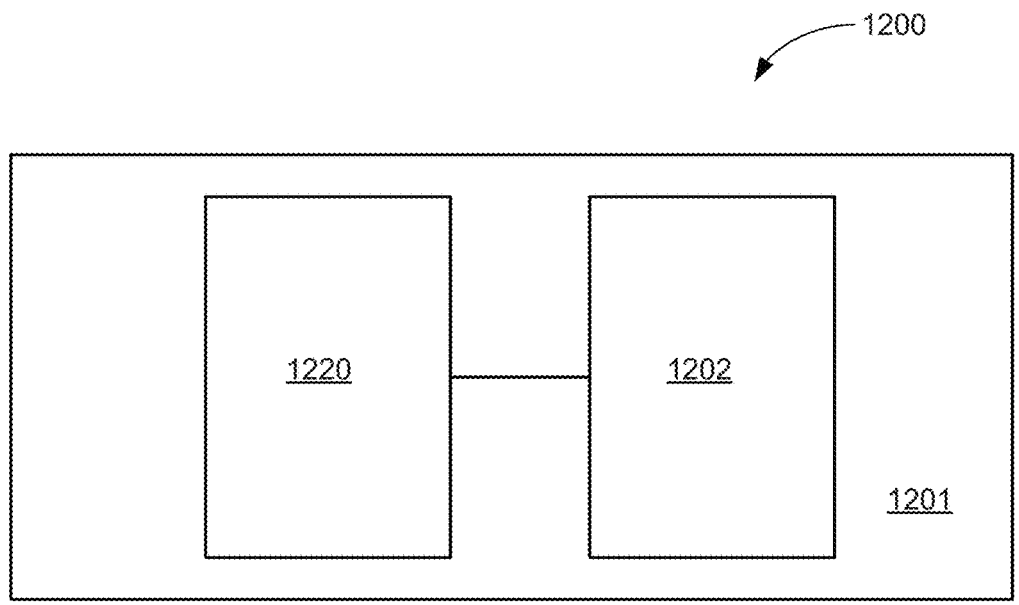
FIG. 12 schematically illustrates a mobile electronic device including a Faradaic energy storage device, in accordance with some embodiments.

FIG. 12 schematically illustrates a mobile electronic device 1200 including a Faradaic energy storage device 1220, in accordance with some embodiments. The Faradaic energy storage device 1220 may comport with embodiments describe herein. The mobile electronic device 1200 may include a housing 1201, an IC die (hereinafter "die 1202," which may comport with embodiments described in connection with die 102) within the housing 1201, and a Faradaic energy storage device 1220 within the housing 1201 and coupled or associated with the die 1202 so as to be capable of providing energy to the die 1202. In some embodiments, being "associated with" die 1202 means Faradaic energy storage device 1220 is integrated into the die 1202 or its packaging in some fashion (e.g., by being implemented on the die itself or by forming part of a PoP architecture or a SoC architecture, etc.). As an example, the Faradaic energy storage device 1220 can be similar to Faradaic energy storage device 600, 700, 800, 900, 1000, or 1100 of FIGS. 6-11. It should be understood, however, that the depictions in the figures of energy storage devices herein may omit certain details for the sake of clarity that may be present in a finished device. These potentially include, for example, one or more collectors attached to particular electrodes (e.g., contacts 624, 626 of FIGS. 6-11) and/or various other packaging components.

The die 1202 may include a processing system (either single core or multi-core). For example, the die 1202 may comprise a microprocessor, a graphics processor, a signal processor, a network processor, a chipset, etc. In one embodiment, the die 1202 comprises an SoC having multiple functional units (e.g., one or more processing units, one or more graphics units, one or more communications units, one or more signal processing units, one or more security units, etc.). However, it should be understood that the disclosed embodiments are not limited to any particular type or class of IC devices. In some embodiments, the mobile electronic device 1200 may further comport with embodiments described in connection with computing device 1500.

Figure 13:
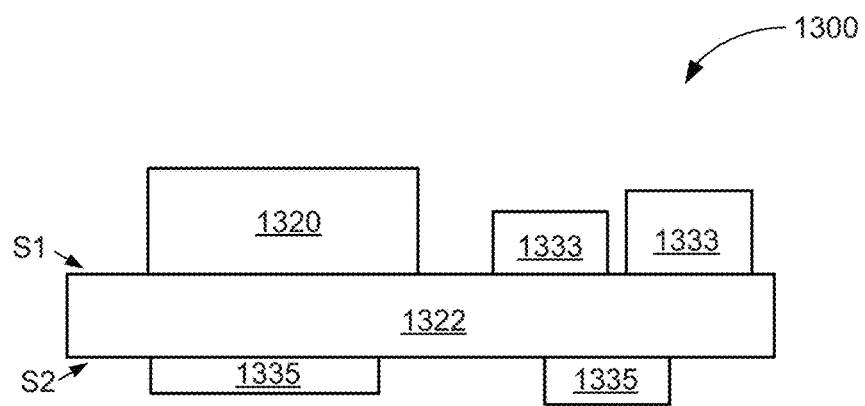
FIG. 13 schematically illustrates an example board configuration including a Faradaic energy storage device, in accordance with some embodiments.

FIG. 13 schematically illustrates an example board configuration 1300 including a Faradaic energy storage device 1320, in accordance with some embodiments. The Faradaic energy storage device 1320 may comport with embodiments described for any of the Faradaic energy storage device configurations described herein. The configuration 1300 may include a number of components disposed on circuit board 1322 such as, for example, a mainboard (e.g., motherboard 1502 of FIG. 15) or other circuit board. Board 1300 includes a first side (e.g., side 51) and an opposing second side (e.g., side S2), and various components may be disposed on either one or both of the first and second sides. In the illustrated embodiment, the configuration 1300 includes a Faradaic energy storage device 1320 disposed on the first side.

The configuration 1300 may be part of any type of computing system (e.g., computing device 1500 of FIG. 15), such as, for example, a hand-held or mobile computing device (e.g., a cell phone, a smart phone, a mobile internet device, a music player, a tablet computer, a laptop computer, a nettop computer, etc.). However, the disclosed embodiments are not limited to hand-held and other mobile computing devices and these embodiments may find application in other types of computing systems, such as desk-top computers and servers and the like.

The circuit board 1322 may comprise any suitable type of circuit board or other substrate capable of providing electrical communication between one or more of the various components disposed on the board. In one embodiment, for example, the circuit board 1322 comprises a printed circuit board (PCB) comprising multiple metal layers separated from one another by a layer of dielectric material and interconnected by electrically conductive vias. Any one or more of the metal layers may be formed in a desired circuit pattern to route—perhaps in conjunction with other metal layers—electrical signals between the components coupled with circuit board 1322. However, it should be understood that the disclosed embodiments are not limited to the above-described PCB and, further, that circuit board 1322 may comprise any other suitable substrate. In some embodiments, the circuit board 1322 may comport with embodiments described in connection with circuit board 122 of FIG. 1 or motherboard 1502 of FIG. 15.

In addition to Faradaic energy storage device 1320, one or more additional components may be disposed on either the first side or the second side of the circuit board 1322. By way of example, as shown in the figures, components 1333 may be disposed on the first side (e.g., side S1) of circuit board 1322, and components 1335 may be disposed on the opposing second side (e.g., side S2) of the circuit board 1322. The components 1333 and/or 1335 may represent any of a variety of suitable components that may be disposed on circuit board 1322 including, for example, IC devices (e.g., processing devices, memory devices, signal processing devices, wireless communication devices, graphics controllers and/or drivers, audio processors and/or controllers, etc.), power delivery components (e.g., a voltage regulator and/or other power management devices, a power supply such as a battery, and/or passive devices such as a capacitor), and one or more user interface devices (e.g., an audio input device, an audio output device, a keypad or other data entry device such as a touch screen display, and/or a graphics display, etc.), as well as any combination of these and/or other devices.

In one embodiment, the configuration 1300 may further include a radiation shield. In a further embodiment, the configuration 1300 may further include a cooling solution. In yet another embodiment, the configuration 1300 may further include an antenna. In yet a further embodiment, the configuration 1300 may be disposed within a housing or case. Where the board is disposed within a housing, some of the components of configuration 1300—e.g., a user interface device, such as a display or keypad, and/or a power supply, such as a battery—may be electrically coupled with circuit board 1322 (and/or a component disposed on this board) but may be mechanically coupled with the housing.

Figure 14:
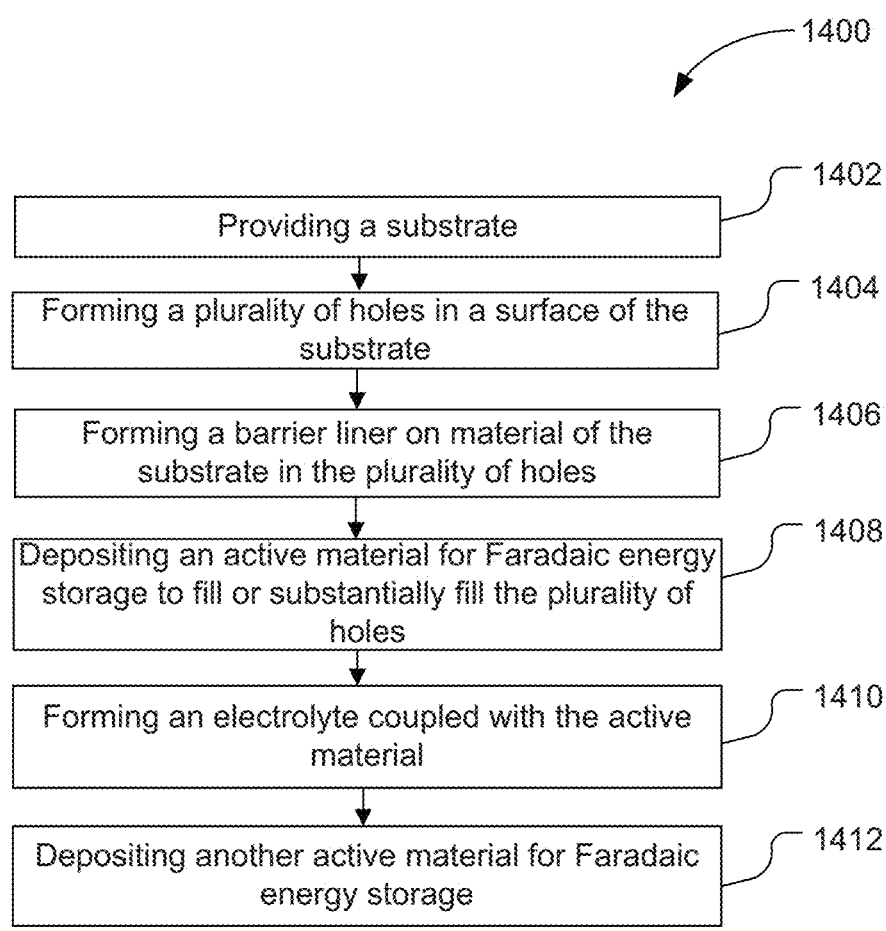
FIG. 14 schematically illustrates a flow diagram for a method of fabricating a Faradaic energy storage device, in accordance with some embodiments.

FIG. 14 schematically illustrates a flow diagram for a method 1400 of fabricating a Faradaic energy storage device (e.g., Faradaic energy storage device 600, 700, 800, 900, 1000, or 1100 of FIGS. 6-11), in accordance with some embodiments. The method 1400 may comport with embodiments described in connection with FIGS. 1-11.

At 1402, the method 1400 may include providing a substrate (e.g., substrate 114 or 1114 of respective FIG. 1 or 11).

At 1404, the method 1400 may include forming a plurality of holes (e.g., holes 108 of FIGS. 2-4) in a surface (e.g., surface S of FIG. 2) of the substrate. The holes may be formed according to techniques described in connection with FIGS. 2-4. In some embodiments, the plurality of holes may include a first plurality of holes to receive a first active material (e.g., active material deposited at 1408) and a second plurality of holes to receive a second active material (e.g., active material deposited at 1412).

In an embodiment where the substrate is composed of metal, the holes may be formed by an etch process. In an embodiment where the substrate is composed of silicon, the holes may be formed by an anisotropic wet etch process. In an embodiment where the substrate is composed of a photosensitive polymer, the holes may be formed by patterning the photosensitive polymer using photolithography and removing portions of the patterned polymer using a development process (e.g., to rinse away exposed or unexposed portions depending on whether a negative or positive photosensitive material is used). The polymer in the holes may be converted to an electrically conductive material.

At 1406, the method 1400 may further include forming a barrier liner (e.g., barrier liner of FIGS. 6-11) on material of the substrate in the plurality of holes. The barrier liner may, for example, be formed by depositing a thin coating of electrically conductive material subsequent to forming the holes and prior to depositing an active material into the holes. In some embodiments, a barrier liner may not be used at all.

At 1408, the method 1400 may further include depositing an active material (e.g., active material such as active material for a lithium (Li)-ion battery or pseudo-capacitive material 550 of FIG. 5, first active material 616 of FIGS. 6-11 or second active material 622 of FIGS. 9-11) for Faradaic energy storage to fill or substantially fill the plurality of holes. The active material may be deposited using, for example, one or more of a doctor-blading, drop-casting, spin-casting or vacuum casting technique. In embodiments where the holes formed at 1404 include a first plurality of holes and second plurality of holes, the active material may be selectively deposited in the first plurality of holes using any suitable technique.

At 1410, the method 1400 may further include forming an electrolyte (e.g., electrolyte 620 of FIGS. 6-11) coupled with the active material. For example, in some embodiments, the electrolyte may be deposited on the active material disposed in the holes and on the surface of the substrate as depicted in connection with FIGS. 6-8 and 11. In other embodiments, the electrolyte may be deposited in an ion channel (e.g., ion channel 930 of FIGS. 9-10) that is formed between adjacent filled holes as depicted, for example, in connection with FIGS. 9 and 10. The ion channel may be formed by laser-drilling the substrate between holes prior to depositing an active material at 1408 according to various embodiments.

At 1412, the method 1400 may further include depositing another active material (e.g., an active material having different reference potential than active material deposited at 1408). For example, in some embodiments, the other active material may correspond with the second active material 622 disposed on the electrolyte 620 of FIGS. 6-8. In some embodiments, the other active material may correspond with the second active material disposed in the filled holes 508 of FIGS. 9-11. In embodiments where the holes formed at 1404 include a first plurality of holes and second plurality of holes, the active material may be selectively deposited in the second plurality of holes using any suitable technique.

Various operations are described as multiple discrete operations in turn, in a manner that is most helpful in understanding the claimed subject matter. However, the order of description should not be construed as to imply that these operations are necessarily order dependent. For example, in some embodiments (e.g., for configurations in FIGS. 9 and 10), forming the electrolyte may be performed prior to depositing the active material at 1408 and/or depositing another active material at 1412. In some embodiments (e.g., for configurations in FIGS. 9-11), depositing the active material at 1408 and/or depositing another active material at 1412 may be performed prior to forming or depositing the electrolyte. In other embodiments (e.g., for configurations in FIGS. 6-8), actions at 1408, 1410 and 1412 may be performed in the order depicted in the flow diagram of FIG. 14. Other actions of the method 1400 may be performed in another suitable order.

Figure 15:
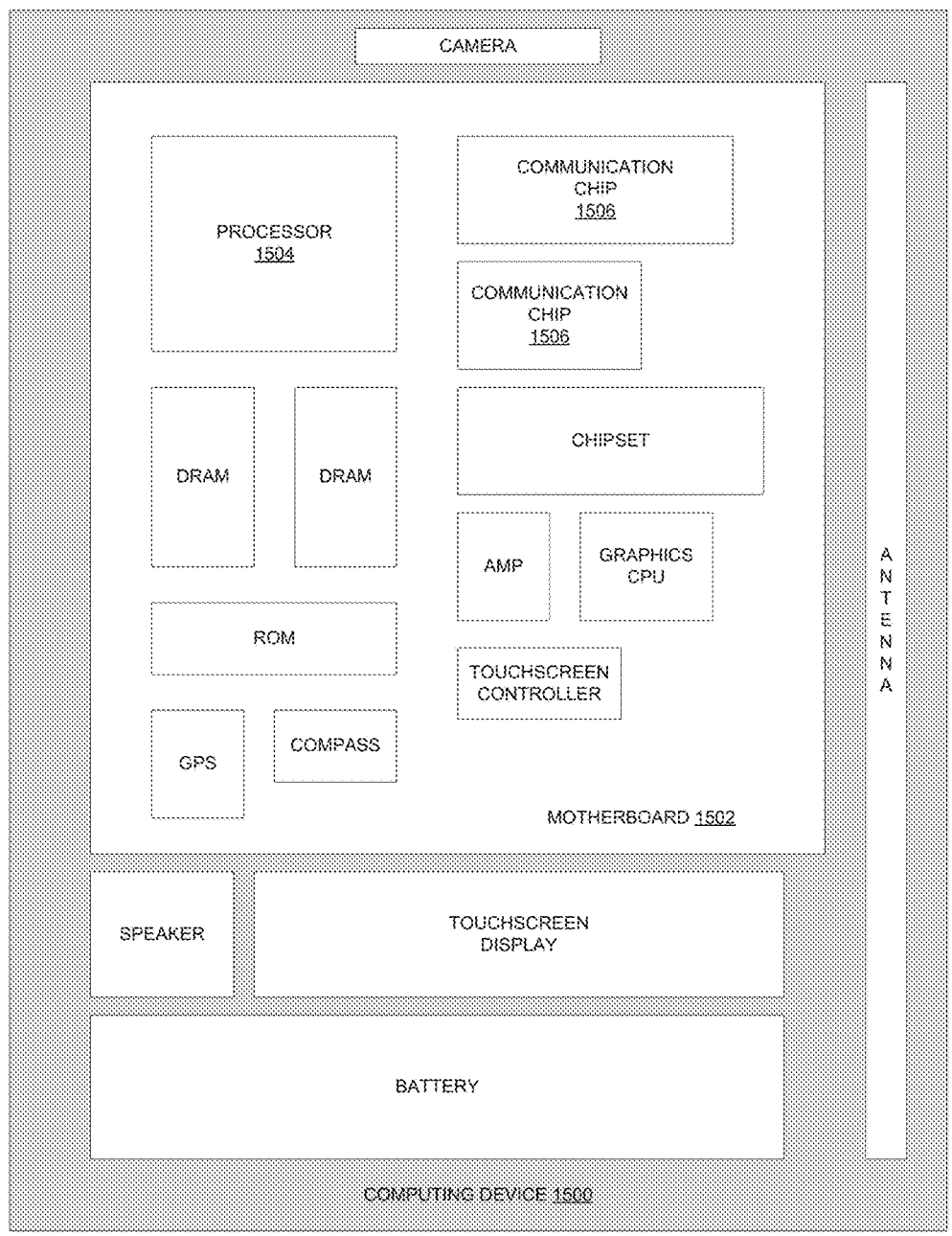
FIG. 15 schematically illustrates a computing device that includes a Faradaic energy storage device as described herein, in accordance with some embodiments.

Embodiments of the present disclosure may be implemented into a system using any suitable hardware and/or software to configure as desired. FIG. 15 schematically illustrates a computing device 1500 that includes a Faradaic energy storage device (e.g., Faradaic energy storage device 600, 700, 800, 900, 1000, or 1100 of FIGS. 6-11) as described herein, in accordance with some embodiments. The computing device 1500 may house a board such as motherboard 1502. The motherboard 1502 may include a number of components, including but not limited to a processor 1504 and at least one communication chip 1506. The processor 1504 may be physically and electrically coupled to the motherboard 1502. In some implementations, the at least one communication chip 1506 may also be physically and electrically coupled to the motherboard 1502. In further implementations, the communication chip 1506 may be part of the processor 1504.

Depending on its applications, computing device 1500 may include other components that may or may not be physically and electrically coupled to the motherboard 1502. These other components may include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, a camera, and a mass storage device (such as hard disk drive, compact disk (CD), digital versatile disk (DVD), and so forth).

The communication chip 1506 may enable wireless communications for the transfer of data to and from the computing device 1500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1506 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra mobile broadband (UMB) project (also referred to as "3GPP2"), etc.). IEEE 802.16 compatible BWA networks are generally referred to as WiMAX networks, an acronym that stands for Worldwide Interoperability for Microwave Access, which is a certification mark for products that pass conformity and interoperability tests for the IEEE 802.16 standards. The communication chip 1506 may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. The communication chip 1506 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). The communication chip 1506 may operate in accordance with Code Division Multiple Access (CDMA), Time Division Multiple Access (TDMA), Digital Enhanced Cordless Telecommunications (DECT), Evolution-Data Optimized (EV-DO), derivatives thereof, as well as any other wireless protocols that are designated as 3G, 4G, 5G, and beyond. The communication chip 1506 may operate in accordance with other wireless protocols in other embodiments.

The computing device 1500 may include a plurality of communication chips 1506. For instance, a first communication chip 1506 may be dedicated to shorter range wireless communications such as Wi-Fi and Bluetooth and a second communication chip 1506 may be dedicated to longer range wireless communications such as GPS, EDGE, GPRS, CDMA, WiMAX, LTE, Ev-DO, and others.

The processor 1504 of the computing device 1500 may be packaged in an IC assembly (e.g., IC assembly 100 of FIG. 1) that includes a component having a Faradaic energy storage device (e.g., Faradaic energy storage device 600, 700, 800, 900, 1000, or 1100 of FIGS. 6-11) as described herein. For example, the circuit board 122 of FIG. 1 may be a motherboard 1502 and the processor 1504 may be a die 102 mounted on a package substrate 104 (e.g., using interposer 103) of FIG. 1. The package substrate 104 and the motherboard 1502 may be coupled together using package-level interconnects. The term "processor" may refer to any device or portion of a device that processes electronic data from registers and/or memory to transform that electronic data into other electronic data that may be stored in registers and/or memory.

The communication chip 1506 may also include a die (e.g., die 102 of FIG. 1) that may be packaged in an IC assembly (e.g., IC assembly 100 of FIG. 1) that includes a component having a Faradaic energy storage device (e.g., Faradaic energy storage device 600, 700, 800, 900, 1000, or 1100 of FIGS. 6-11) as described herein. In further implementations, another component (e.g., memory device or other integrated circuit device) housed within the computing device 1500 may include a die (e.g., die 102 of FIG. 1) that may be packaged in an IC assembly (e.g., IC assembly 100 of FIG. 1) that includes a component having a Faradaic energy storage device (e.g., Faradaic energy storage device 600, 700, 800, 900, 1000, or 1100 of FIGS. 6-11) as described herein.

In various implementations, the computing device 1500 may be a laptop, a netbook, a notebook, an ultrabook, a smart phone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1500 may be any other electronic device that processes data.

According to various embodiments, the motherboard 1502 of the computing device 1500 may comport with embodiments described in connection with the circuit board 1322 of FIG. 13 or the circuit board of FIG. 1, or vice versa. The computing device 1500 may comport with embodiment described in connection with mobile electronic device 1200 of FIG. 12 and vice versa.

EXAMPLES

According to various embodiments, the present disclosure describes an apparatus (e.g., IC assembly) including a substrate having a plurality of holes disposed in a surface of the substrate and an active material for Faradaic energy storage disposed in the plurality of holes to substantially fill the plurality of holes. In some embodiments, the substrate includes semiconductive material, polymer or metal. In some embodiments, the substrate is part of an integrated circuit (IC) assembly. In some embodiments, the substrate includes silicon of an IC die. In some embodiments, the active material is active material of a Faradaic energy storage device, the IC die includes electronic circuitry and the Faradaic energy storage device is operatively coupled with the electronic circuitry and configured to provide energy to the electronic circuitry.

In some embodiments, a dimension across individual openings of the plurality of holes is from 0.1 micron to 200 microns, the dimension being in a direction that is substantially parallel with a plane defined by the surface of the substrate, the plurality of holes have a depth from 5 microns to 500 microns and a pitch between the individual holes of the plurality holes is from 1 micron to 250 microns. In some embodiments, the plurality of holes are configured in an array of multiple rows.

In some embodiments, the active material comprises a pseudo-capacitive material in powder form, electrically conductive additive mixed with the pseudo-capacitive material and a binder material. In some embodiments, the active material comprises an active material for a lithium (Li)-ion battery electrode.

In some embodiments, the apparatus further includes a barrier liner disposed on material of the substrate in the plurality of holes, wherein the barrier liner includes an electrically conductive material disposed between the material of the substrate and the active material. In some embodiments, the active material is a first active material and the apparatus further includes an electrolyte coupled with the first active material and a second active material for energy storage coupled with the electrolyte, wherein the electrolyte is disposed between the first active material and the second active material to conduct ions between the first active material and the second active material, and the first active material has a standard electrode potential that is different than a standard electrode potential of the second material. In some embodiments, the electrolyte is disposed on the surface of the substrate and in direct contact with the first active material disposed in at least two holes of the plurality of holes and the second active material is disposed on the electrolyte.

In some embodiments, the plurality of holes is a first plurality of holes, the apparatus further including a second plurality of holes disposed in the surface of the substrate and an ion channel disposed between at least a first hole of the first plurality of holes and a second hole of the second plurality of holes, wherein the second active material is disposed in the second hole and the electrolyte is disposed in the ion channel. In some embodiments, the substrate is a first substrate and the plurality of holes are a first plurality of holes, the apparatus further including a second substrate having a second plurality of holes disposed in a surface of the second substrate, wherein the second active material is disposed in the second plurality of holes to substantially fill the second plurality of holes.

According to various embodiments the present disclosure describes a method including forming a plurality of holes in a surface of a substrate and depositing an active material for Faradaic energy storage to substantially fill the plurality of holes. In some embodiments, the substrate is composed of metal or semiconductive material, forming the plurality of holes comprises etching the substrate and the plurality of holes are configured in an array of multiple rows. In some embodiments, the substrate is composed of silicon and forming the plurality of holes comprises etching the substrate using an anisotropic wet etch process. In some embodiments, the substrate is composed of a photosensitive polymer and forming the plurality of holes comprises patterning the photosensitive polymer using photolithography, removing portions of the patterned polymer using a development process and converting the polymer to an electrically conductive material.

In some embodiments, depositing the active material comprises depositing a pseudo-capacitive material or active material for a lithium (Li)-ion battery electrode using one or more of a doctor-blading, drop-casting, spin-casting or vacuum casting technique. In some embodiments, the method may further include forming a barrier liner on material of the substrate in the plurality of holes prior to depositing the active material, wherein the barrier liner includes an electrically conductive material disposed between the material of the substrate and the active material. In some embodiments, the active material is a first active material, the method further including forming an electrolyte coupled with the first active material and depositing a second active material, the second active material being coupled with the electrolyte, wherein the electrolyte is disposed between the first active material and the second active material to conduct ions between the first active material and the second active material, and the first active material has a standard electrode potential that is different than a standard electrode potential of the second active material.

In some embodiments, the plurality of holes is a first plurality of holes, the method further comprising forming a second plurality of holes in the surface of the substrate and forming an ion channel between at least a first hole of the first plurality of holes and a second hole of the second plurality of holes, depositing a second active material in the second plurality of holes and depositing an electrolyte in the ion channel, wherein the first active material has a standard electrode potential that is different than a standard electrode potential of the second active material.

According to various embodiments, the present disclosure describes a mobile electronic device including a housing, an integrated circuit (IC) die disposed within the housing and a Faradaic energy storage device coupled with the IC die to provide energy to the IC die, wherein the Faradaic energy storage device comprises a substrate having a plurality of holes disposed in a surface of the substrate and an active material for Faradaic energy storage disposed in the plurality of holes to substantially fill the plurality of holes. In some embodiments, the mobile electronic device further includes a circuit board, wherein the IC die is coupled with the circuit board and wherein the substrate includes material of the IC die. In some embodiments, the mobile electronic device further includes one or more of an antenna, a display, a touchscreen display, a touchscreen controller, a battery, an audio codec, a video codec, a power amplifier, a global positioning system (GPS) device, a compass, a Geiger counter, an accelerometer, a gyroscope, a speaker, or a camera coupled with the circuit board, wherein the mobile electronic device is one of a laptop, a netbook, a notebook, an ultrabook, a smartphone, a tablet, a personal digital assistant (PDA), an ultra mobile PC, a mobile phone, a digital camera, a portable music player, or a digital video recorder.

Various embodiments may include any suitable combination of the above-described embodiments including alternative (or) embodiments of embodiments that are described in conjunctive form (and) above (e.g., the "and" may be "and/or"). Furthermore, some embodiments may include one or more articles of manufacture (e.g., non-transitory computer-readable media) having instructions, stored thereon, that when executed result in actions of any of the above-described embodiments. Moreover, some embodiments may include apparatuses or systems having any suitable means for carrying out the various operations of the above-described embodiments.

The above description of illustrated implementations, including what is described in the Abstract, is not intended to be exhaustive or to limit the embodiments of the present disclosure to the precise forms disclosed. While specific implementations and examples are described herein for illustrative purposes, various equivalent modifications are possible within the scope of the present disclosure, as those skilled in the relevant art will recognize.

These modifications may be made to embodiments of the present disclosure in light of the above detailed description. The terms used in the following claims should not be construed to limit various embodiments of the present disclosure to the specific implementations disclosed in the specification and the claims. Rather, the scope is to be determined entirely by the following claims, which are to be construed in accordance with established doctrines of claim interpretation.

What is claimed is:

1. A method comprising:
    forming a plurality of holes in a surface of a substrate, wherein the substrate is composed of a photosensitive polymer; and
    depositing an active material for Faradaic energy storage to substantially fill the plurality of holes, wherein the active material includes a plurality of discrete particles formed of a pseudo-capacitive material in powder form, an electrically conductive additive mixed with the pseudo-capacitive material, and a binder material;
    wherein forming the plurality of holes comprises:
        patterning the photosensitive polymer using photolithography;
        removing portions of the patterned polymer using a development process; and
        converting the polymer to an electrically conductive material.

2. The method of claim 1, wherein depositing the active material comprises depositing the pseudo-capacitive material using one or more of a doctor-blading, drop-casting, spin-casting or vacuum casting technique.

3. The method of claim 1, further comprising:
    forming a barrier liner on material of the substrate in the plurality of holes prior to depositing the active material, wherein the barrier liner includes an electrically conductive material disposed between the material of the substrate and the active material.

4. The method of claim 1, wherein the active material is a first active material, the method further comprising:
    forming an electrolyte coupled with the first active material; and
    depositing a second active material, the second active material being coupled with the electrolyte, wherein the electrolyte is disposed between the first active material and the second active material to conduct ions between the first active material and the second active material, and the first active material has a standard electrode potential that is different than a standard electrode potential of the second active material.

5. A method comprising:
forming a plurality of holes in a surface of a substrate; and
depositing an active material for Faradaic energy storage to substantially fill the plurality of holes, wherein the active material includes a plurality of discrete particles formed of a pseudo-capacitive material in powder form, an electrically conductive additive mixed with the pseudo-capacitive material, and a binder material, wherein:
the substrate is composed of silicon;
forming the plurality of holes comprises etching the substrate using an anisotropic wet etch process; and
the plurality of holes are configured in an array of multiple rows.

6. The method of claim 2, wherein depositing the active material comprises depositing the pseudo-capacitive material using one or more of a doctor-blading, drop-casting, spin-casting or vacuum casting technique.

7. The method of claim 2, further comprising:
forming a barrier liner on material of the substrate in the plurality of holes prior to depositing the active material, wherein the barrier liner includes an electrically conductive material disposed between the material of the substrate and the active material.

8. A method comprising:
forming a first plurality of holes in a surface of a substrate;
depositing an active material for Faradaic energy storage to substantially fill the first plurality of holes, wherein the active material includes a plurality of discrete particles formed of a pseudo-capacitive material in powder form, an electrically conductive additive mixed with the pseudo-capacitive material, and a binder material;
forming a second plurality of holes in the surface of the substrate; and
forming an ion channel between at least a first hole of the first plurality of holes and a second hole of the second plurality of holes;
depositing a second active material in the second plurality of holes; and
depositing an electrolyte in the ion channel, wherein the first active material has a standard electrode potential that is different than a standard electrode potential of the second active material.

9. The method of claim 8, wherein:
the substrate is composed of metal or semiconductive material;
forming the first plurality of holes comprises etching the substrate; and
the first plurality of holes are configured in an array of multiple rows.

10. The method of claim 9, wherein the substrate is composed of silicon and forming the first plurality of holes comprises etching the substrate using an anisotropic wet etch process.

11. The method of claim 8, wherein the substrate is composed of a photosensitive polymer and forming the first plurality of holes comprises:
patterning the photosensitive polymer using photolithography;
removing portions of the patterned polymer using a development process; and
converting the polymer to an electrically conductive material.

12. The method of claim 8, wherein depositing the active material comprises depositing the pseudo-capacitive material using one or more of a doctor-blading, drop-casting, spin-casting or vacuum casting technique.

13. The method of claim 8, further comprising:
forming a barrier liner on material of the substrate in the first plurality of holes prior to depositing the active material, wherein the barrier liner includes an electrically conductive material disposed between the material of the substrate and the active material.

* * * * *